United States Patent
Hsieh

(10) Patent No.: US 7,880,627 B2
(45) Date of Patent: Feb. 1, 2011

(54) FAN DETECTING APPARATUS

(75) Inventor: Ming-Chih Hsieh, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 742 days.

(21) Appl. No.: 11/942,724

(22) Filed: Nov. 20, 2007

(65) Prior Publication Data

US 2008/0238705 A1 Oct. 2, 2008

(30) Foreign Application Priority Data

Apr. 2, 2007 (CN) .......................... 2007 1 0200380

(51) Int. Cl.
*G08B 21/00* (2006.01)
(52) U.S. Cl. .................. 340/635; 361/694; 361/679.46; 73/861; 702/189
(58) Field of Classification Search ................. 340/635; 361/679.46, 679.48, 679.49, 679.47, 679.6, 361/706, 694–697; 702/189, 193; 73/861, 73/861.08
See application file for complete search history.

(56) References Cited

U.S. PATENT DOCUMENTS

| | | | |
|---|---|---|---|
| 4,644,474 A | 2/1987 | Aposchanski et al. | |
| 5,886,639 A * | 3/1999 | Behl et al. | 340/635 |
| 7,161,454 B2 * | 1/2007 | LaBoube et al. | 336/55 |
| 7,168,312 B2 * | 1/2007 | Akamatsu | 73/204.15 |
| 7,619,535 B2 * | 11/2009 | Chen et al. | 340/635 |
| 2005/0118029 A1 * | 6/2005 | Kim | 417/18 |
| 2008/0106228 A1 * | 5/2008 | Ye et al. | 318/479 |

* cited by examiner

*Primary Examiner*—George A Bugg
*Assistant Examiner*—Edny Labbees
(74) *Attorney, Agent, or Firm*—Frank R. Niranjan

(57) ABSTRACT

A fan detecting apparatus for detecting at least two fans includes a processing unit, at least two airflow switches, and at least two indicating units. The processing unit includes a first terminal configured to output a driving signal, a second terminal configured to receive the driving signal, and a third terminal, the processing unit alarming when the second terminal does not receive the driving signal from the first terminal. The at least two airflow switches are serially coupled between the first and second terminals, monitor airflow from at least two fans in a computer room, and turn on or off according to strength of airflow from the at least two fans. The indicating units are respectively coupled between corresponding airflow switches and the third terminal of the processing unit, and indicate status of corresponding fans according to on or off status of the airflow switches.

10 Claims, 1 Drawing Sheet

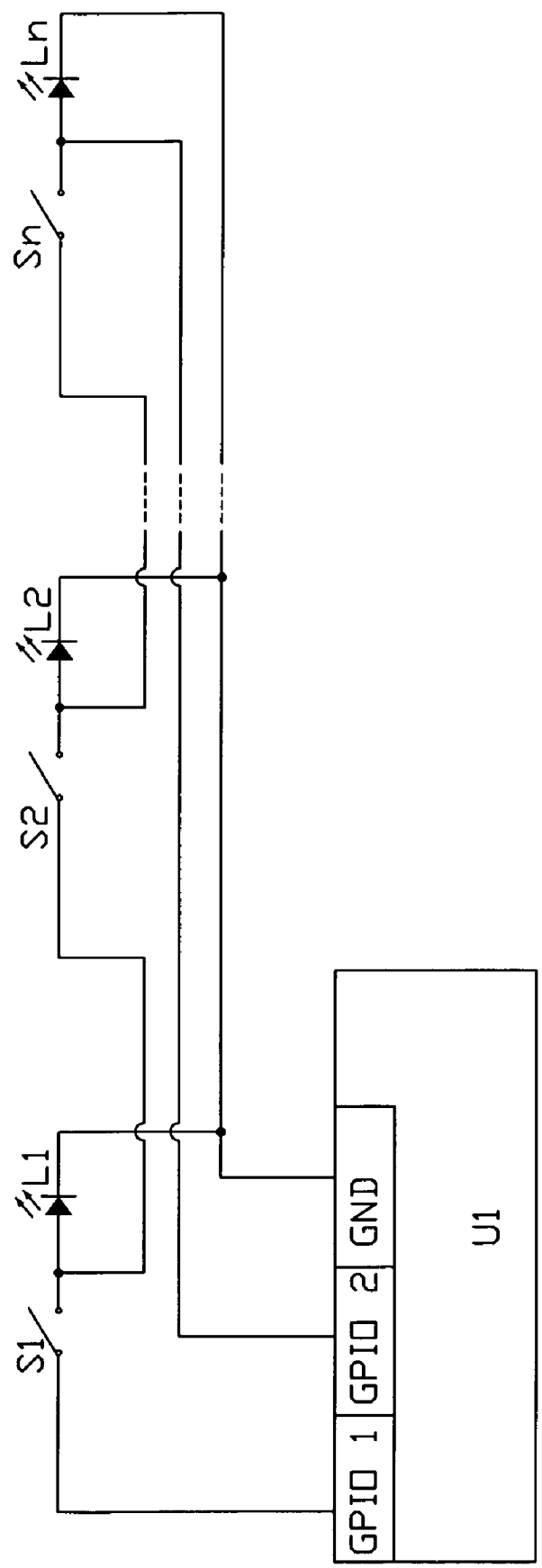

FAN DETECTING APPARATUS

BACKGROUND

1. Field of the Invention

The present invention relates to detecting apparatuses, and particularly to a detecting apparatus which can detect whether fans in a computer room are working normally.

2. Description of Related Art

Developments in today's highly information-intensive society have led to remarkable improvements in performances of electronic devices. During operation of many contemporary electronic devices such as central processing units (CPUs), large amounts of heat are produced. Typically, fans are used to facilitate removal of heat in computers. The fans must be running stably, so as to prevent the device from becoming unstable or being damaged. If the fans in a computer room run unstably or even cease running, heat generated from the CPUs will not be dissipated on time and will ruin the CPUs.

What is needed, therefore, is to provide a detecting apparatus which can detect whether a plurality of fans in a computer room are working normally.

SUMMARY

An exemplary fan detecting apparatus for detecting at least two fans includes a processing unit, at least two airflow switches, and at least two indicating units. The processing unit includes a first terminal configured to output a driving signal, a second terminal configured to receive the driving signal, and a third terminal, the processing unit alarming when the second terminal does not receive the driving signal from the first terminal. The at least two airflow switches are serially coupled between the first and second terminals, monitor airflow from at least two fans in a computer room, and turn on or off according to strength of airflow from the at least two fans. The indicating units are respectively coupled between corresponding airflow switches and the third terminal of the processing unit, and indicate status of corresponding fans according to on or off status of the airflow switches.

Other advantages and novel features of the present invention will become more apparent from the following detailed description of preferred embodiment when taken in conjunction with the accompanying drawing, in which:

BRIEF DESCRIPTION OF THE DRAWING

The drawing is a circuit diagram of an embodiment of a fan detecting apparatus in accordance with the present invention.

DETAILED DESCRIPTION

Referring to the drawing, a fan detecting apparatus in accordance with an embodiment of the present invention includes a processing unit U1, N airflow switches S1, S2, and so on through to Sn, and N light-emitting diodes (LEDs) L1, L2, and so on through to Ln. The fan detecting apparatus is used to detect N fans. N is a natural number greater than or equal to 2.

In this embodiment, the processing unit U1 includes a first terminal GPIO1, a second terminal GPIO2, and a ground terminal GND. The first terminal GPIO1 is used to output a driving signal, the second terminal GPIO2 is used to receive the driving signal, the processing unit U1 alarms when the second terminal GPIO2 does not receive the driving signal from the first terminal GPIO1. The airflow switches S1, S2, and so on through to Sn are serially coupled between the first terminal GPIO1 and the second terminal GPIO2, and are respectively disposed at air outlets of corresponding fans. The airflow switches S1, S2, and so on through to Sn are on when corresponding fans rotate normally, that is, strength of airflow from corresponding fans is greater than or equal to a predetermined value, and the airflow switches S1, S2, and so on through to Sn are off when strength of airflow from corresponding fans is less than the predetermined value. The LEDs L1, L2, and so on through to Ln are respectively coupled between corresponding airflow switches S1, S2, and so on through to Sn and the ground terminal GND, with the anodes connected to corresponding airflow switches S1, S2, and so on through to Sn, and the cathodes connected to the ground terminal GND. The LEDs L1, L2, and so on through to Ln can be replaced by other luminous elements, for example xenon lamps.

The fan corresponding to the airflow switch S2 stops rotating is provided as an example to illustrate how the fan detecting apparatus works. The driving signal from the first terminal GPIO1 is a high level signal. When the fan corresponding to the airflow switch S2 stops rotating and other fans rotate normally, the airflow switch S2 turns off, the other airflow switches S1, S3, and so on through to Sn are still on. Therefore the high level signal cannot be transmitted to the second terminal GPIO2, and the processing unit U1 alarms to indicate some of the fans have stopped rotating. The high level driving signal from the first terminal GPIO1 is transmitted to the LED L1 because the airflow switch S1 is on, and drives the LED L1 emitting light to indicate the corresponding fan rotates normally. Because airflow switches S2, S3, and so on through to Sn are serially connected, that is, when the airflow switch S2 turns off, the high level signal cannot be transmitted to the LEDs L2, L3, and so on through to Ln. Therefore LEDs L2, L3, and so on through to Ln do not emit light to indicate the fan corresponding to the airflow switch S2 has stopped rotating.

When the fans corresponding to the airflow switches S2, S4 stop rotating and other fans rotate normally, the airflow switches S2, S4 turn off, the airflow switches S1, S3, S5, and so on through to Sn are still on. Therefore the high level signal can not be transmitted to the second terminal GPIO2, and the processing unit U1 alarms to indicate some of the fans have stopped rotating. The high level driving signal from the first terminal GPIO1 drives the LED L1 emitting light to indicate the corresponding fan rotates normally. The LEDs L2, L3, and so on through to Ln do not emit light because the airflow switch S2 is off. The fan corresponding to the airflow switch S2 has to be repaired or replaced firstly, then the LEDs L1, L2, L3 will emit light, but the LEDs L4, L5, and so on through to Ln still do not emit light. Once the fan corresponding to the airflow switch S4 has been repaired or replaced, the LEDs L1, L2, and so on through to Ln all emit light to indicate all of the fans rotate normally.

The fan detecting apparatus detects a plurality of fans according to airflow from the fans, and reminds users to repair or replace the fans as needed. Therefore damage to the CPUs can be avoided.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan detecting apparatus, comprising:
a processing unit with a first terminal configured to output a driving signal, a second terminal configured to receive the driving signal, and a third terminal, the processing unit alarming when the second terminal does not receive the driving signal from the first terminal;
at least two airflow switches configured for monitoring airflow from at least two fans in a computer room, the at least two airflow switches serially coupled between the first and second terminals, and turned on or off according to strength of airflow from the at least two fans; and
at least two indicating units respectively coupled between corresponding airflow switches and the third terminal of the processing unit, the indicating units indicating status of corresponding fans according to on or off status of the airflow switches.

2. The fan detecting apparatus as claimed in claim 1, wherein the third terminal of the processing unit is a ground terminal.

3. The fan detecting apparatus as claimed in claim 1, wherein the airflow switches are respectively disposed at air outlets of corresponding fans.

4. The fan detecting apparatus as claimed in claim 1, wherein the indicating units are light-emitting diodes (LEDs).

5. The fan detecting apparatus as claimed in claim 4, wherein the anodes of the LEDs are respectively coupled to corresponding airflow switches, the cathodes of the LEDs are coupled to the third terminal of the processing unit.

6. The fan detecting apparatus as claimed in claim 1, wherein the airflow switches are on when strength of airflow from corresponding fans is greater than or equal to a predetermined value, the airflow switches are off when strength of airflow from corresponding fans is less than the predetermined value.

7. A fan detecting apparatus, comprising:
a processing unit with a first terminal configured to output a driving signal, a second terminal configured to receive the driving signal, and a third terminal, the processing unit alarming when the second terminal does not receive the driving signal from the first terminal;
at least two airflow switches configured for monitoring airflow from at least two fans in a computer room, the at least two airflow switches serially coupled between the first and second terminals, and turned on or off according to strength of airflow from the at least two fans; and
at least two LEDs configured for indicating status of the at least two fans according to on or off status of the airflow switches, the anode of each of the LEDs respectively coupled to a corresponding airflow switch, the cathodes of the LEDs coupled to the third terminal of the processing unit.

8. The fan detecting apparatus as claimed in claim 7, wherein the third terminal of the processing unit is a ground terminal.

9. The fan detecting apparatus as claimed in claim 7, wherein the airflow switches are respectively disposed at air outlets of corresponding fans.

10. The fan detecting apparatus as claimed in claim 7, wherein the airflow switches are on when strength of airflow from corresponding fans is greater than or equal to a predetermined value, the airflow switches are off when strength of airflow from corresponding fans is less than the predetermined value.

* * * * *